US012663471B2

(12) United States Patent
    Kobylanski

(10) Patent No.: US 12,663,471 B2
(45) Date of Patent: Jun. 23, 2026

(54) POLE DISCONNECT INDICATOR AND TEST SWITCH ASSEMBLIES FOR ELECTRICAL SWITCHBOARDS

(71) Applicant: ABB Schweiz AG, Baden (CH)

(72) Inventor: Alex Kobylanski, Pinetops, NC (US)

(73) Assignee: ABB Schweiz AG, Baden (CH)

( * ) Notice: Subject to any disclaimer, the term of this patent is extended or adjusted under 35 U.S.C. 154(b) by 263 days.

(21) Appl. No.: 18/413,860

(22) Filed: Jan. 16, 2024

(65) Prior Publication Data

US 2025/0231238 A1      Jul. 17, 2025

(51) Int. Cl.
    G01R 31/327      (2006.01)
    G01R 1/20      (2006.01)
    H01H 71/04      (2006.01)

(52) U.S. Cl.
    CPC ............. G01R 31/327 (2013.01); G01R 1/20 (2013.01); H01H 71/04 (2013.01)

(58) Field of Classification Search
    CPC .... G01R 31/327; G01R 31/3271; G01R 1/20; H01H 3/00; H01H 3/02; H01H 3/04; H01H 13/50; H01H 13/506; H01H 71/00; H01H 71/04; H01H 71/06; H01H 71/52; H01H 2009/20; H01H 2009/26; H01H 2009/265; H01H 2009/28; H01H 2221/052
    USPC ......................................................... 200/5 A
    See application file for complete search history.

(56) References Cited

U.S. PATENT DOCUMENTS

| | | | |
|---|---|---|---|
| 5,109,142 A | * | 4/1992 | von Kannewurff .......................... H01H 71/1018 335/8 |
| 6,541,719 B1 | * | 4/2003 | Powell ............... H01H 71/1018 200/50.33 |
| D554,068 S | | 10/2007 | Fasce et al. |
| D900,037 S | | 10/2020 | Wu |
| 2012/0247266 A1 | * | 10/2012 | Takagi ................... H01H 15/10 74/548 |
| 2015/0200497 A1 | | 7/2015 | Basoukeas et al. |
| 2025/0231238 A1 | | 7/2025 | Kobylanski |

OTHER PUBLICATIONS

3-Pole Vs. 4-Pole Isolator Switches: When and How to Use Each. ToSkunLux, blog artilce. Retrieved online at: https://www.tosunlux. eu/blog/3-pole-vs-4-pole-isolator-switch-when-how-to-use/. 1 page, Jul. 22, 2025.

(Continued)

*Primary Examiner* — Anthony R Jimenez
(74) *Attorney, Agent, or Firm* — McCarter & English, LLP; Michael M. Gnibus

(57) ABSTRACT

A test switch assembly for testing electrical switchboard devices is provided. The test switch assembly includes a test switch including a handle, the handle having a first color. The handle includes a label holder including a front, the label holder defining a label slot in the front, the label slot sized to receive a label. The handle further includes a handle body extending from the label holder and defining a tie bar aperture sized to receive a tie bar configured to connect the test switch with one or more other test switches in the test switch assembly. The test switch assembly further includes an indicator coupled with the handle body of the test switch, the indicator having a second color different from the first color, the indicator exposing the tie bar aperture.

20 Claims, 5 Drawing Sheets

(56)         References Cited

OTHER PUBLICATIONS

States test switches. States by Megger, product listing. Retrieved online at: https://www.statesproducts.com/product-test-switches. php . 2 pages, Jan. 19, 2012.
Non-Final Office Action for U.S. Appl. No. 29/908,957, dated Dec. 11, 2025, 6 pages.

* cited by examiner

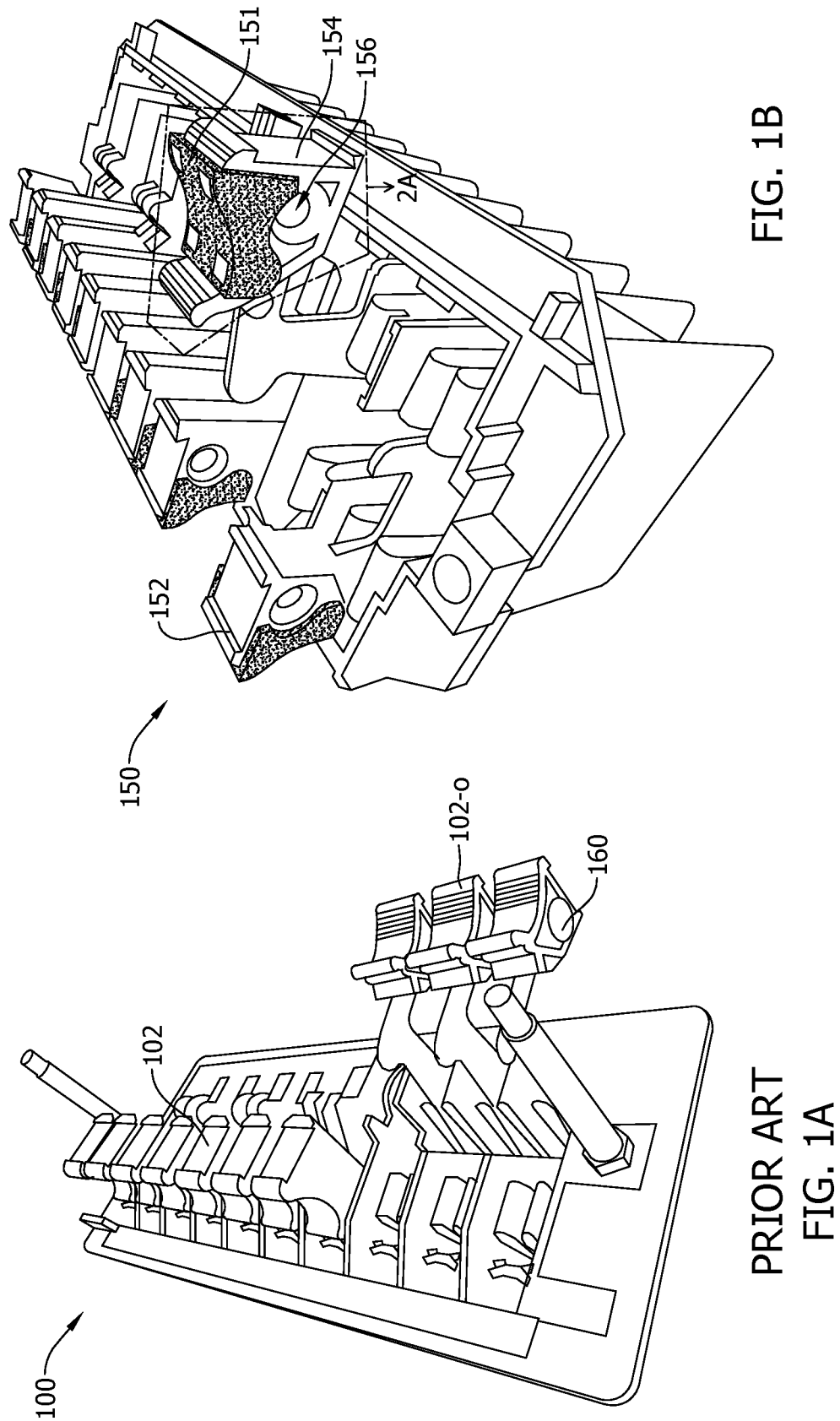
FIG. 1B
PRIOR ART
FIG. 1A

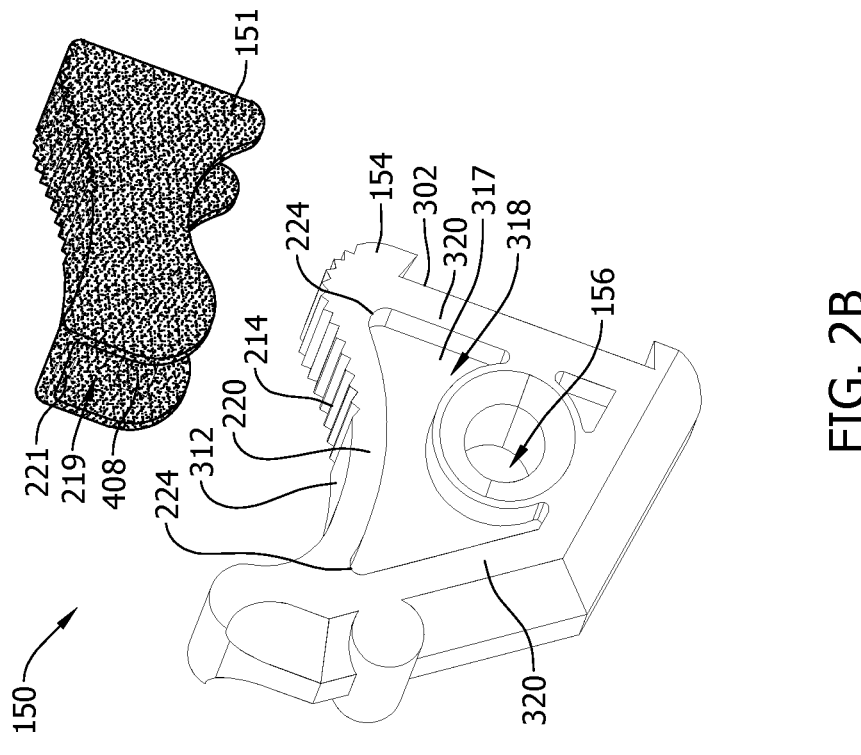
FIG. 2B
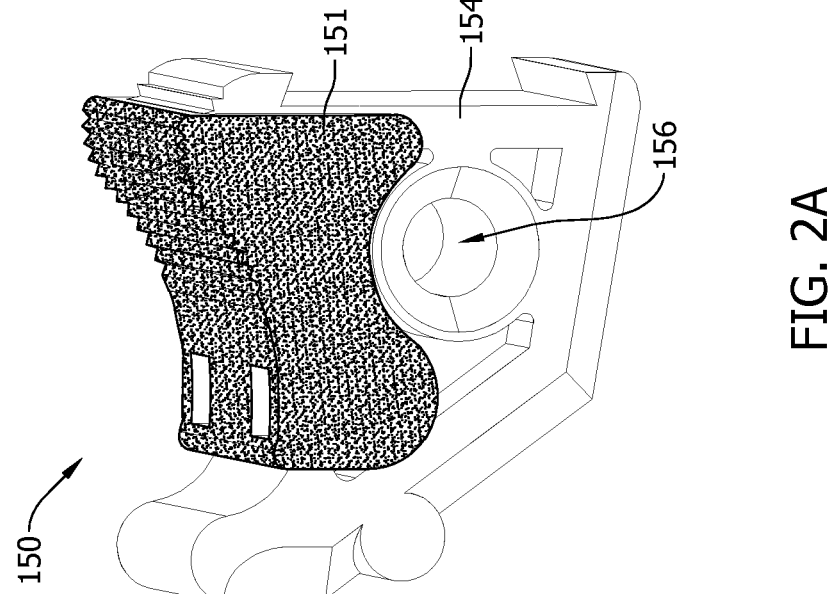
FIG. 2A

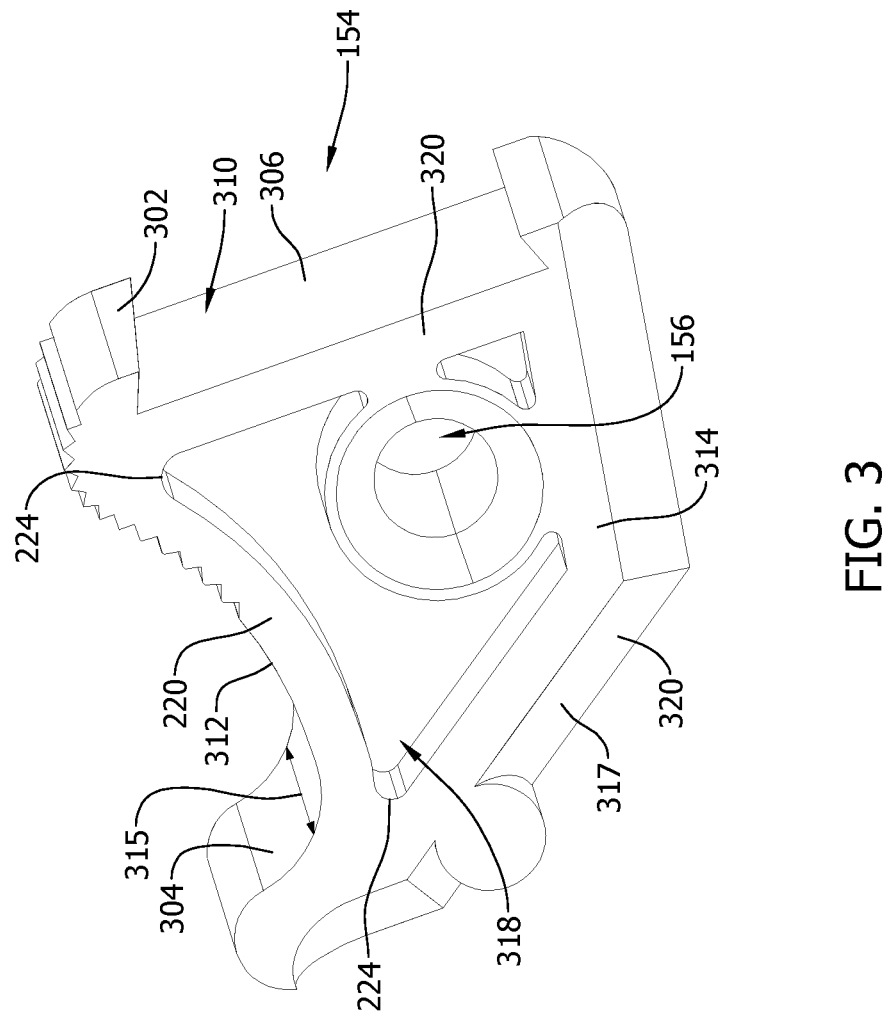
FIG. 3

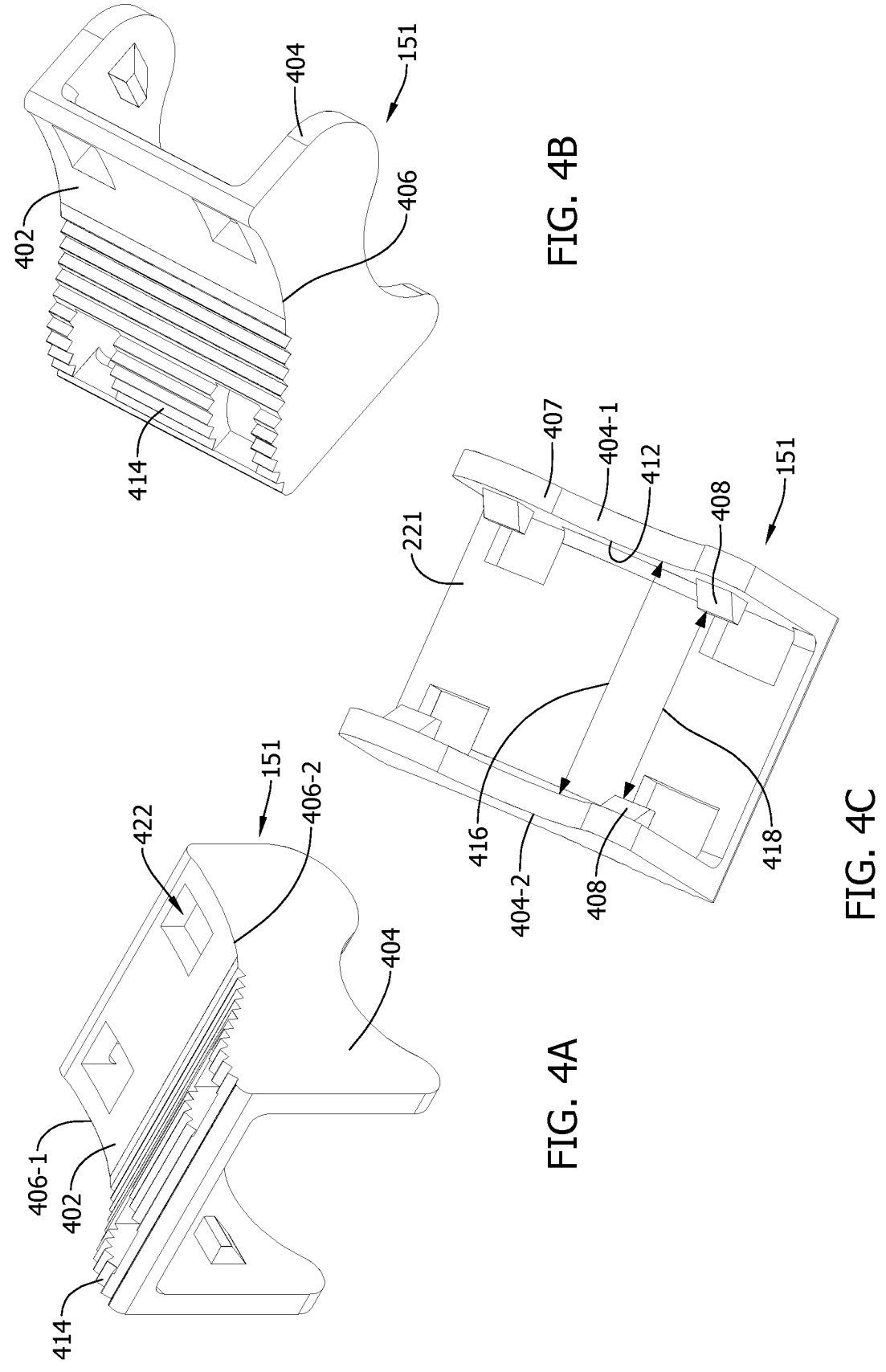
FIG. 4B
FIG. 4C
FIG. 4A

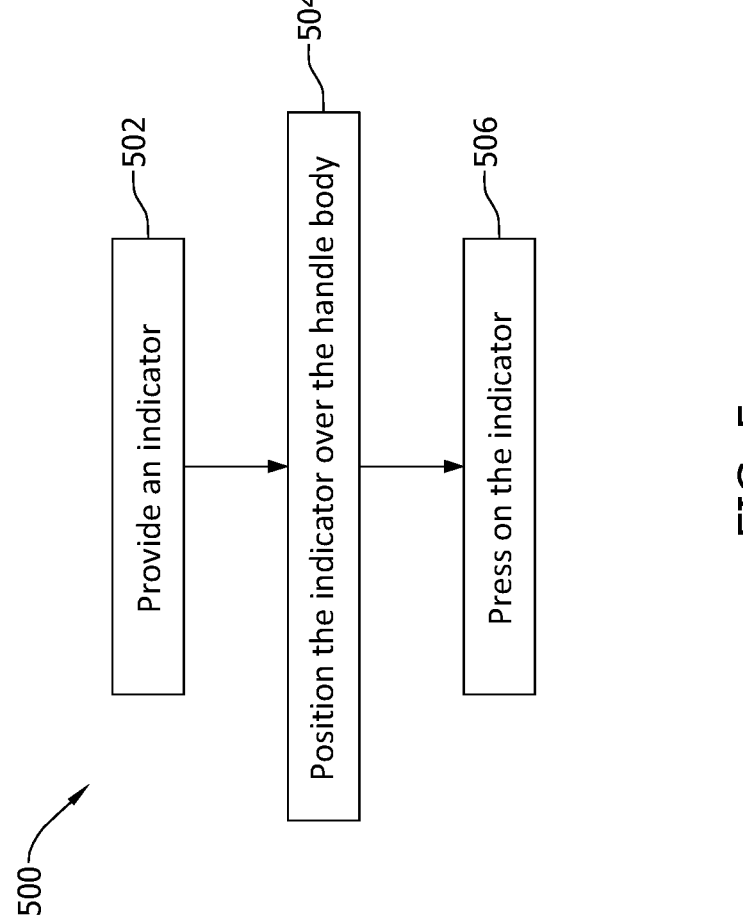
FIG. 5

POLE DISCONNECT INDICATOR AND TEST SWITCH ASSEMBLIES FOR ELECTRICAL SWITCHBOARDS

BACKGROUND

The field of the disclosure relates generally to test switches for electrical equipment, and more particularly, to test switches for electrical switchboard devices.

Test switches are used in multi-circuit testing of switchboard devices, such as relays, meters, and instruments. During testing, switches are open and closed in order to verify proper operation of the devices. After testing, test switches are closed for normal operation. To verify the switches are closed to ensure the devices operate as intended such as providing protection to electrical equipment, a visual inspection of the switches is required after testing is completed. Known assemblies and methods are disadvantaged in some aspects in meeting the needs of electrical switchboards and improvements are desired.

BRIEF DESCRIPTION

In one aspect, a test switch assembly for testing electrical switchboard devices is provided. The test switch assembly includes a test switch including a handle, the handle having a first color. The handle includes a label holder including a front, the label holder defining a label slot in the front, the label slot sized to receive a label. The handle further includes a handle body extending from the label holder and defining a tie bar aperture sized to receive a tie bar configured to connect the test switch with one or more other test switches in the test switch assembly. The test switch assembly further includes an indicator coupled with the handle body of the test switch, the indicator having a second color different from the first color, the indicator exposing the tie bar aperture.

In another aspect, an indicator for detecting an open test switch in a test switch assembly for testing electrical switchboard devices is provided. The test switch assembly includes a test switch, the test switch including a handle, the handle having a first color. The handle includes a label holder and a handle body extending from the label holder and defining a tie bar aperture sized to receive a tie bar. The indicator includes an indicator top having a first edge and a second edge opposite the first edge, a first indicator side extending from the first edge, and a second indicator side extending from the second edge. The indicator is configured to couple with the handle and sized to expose the tie bar aperture and a front of the label holder when the indicator is coupled with the handle, the indicator having a second color different from the first color.

In one more aspect, a method of assembling a test switch assembly for testing electrical switchboard devices is provided. The test switch assembly includes a test switch, the test switch including a handle, the handle having a first color. The handle includes a label holder and a handle body extending from the label holder and defining a tie bar aperture sized to receive a tie bar. The method includes providing an indicator. The indicator includes an indicator top having a first edge and a second edge opposite the first edge, a first indicator side extending from the first edge, and a second indicator side extending from the second edge. The indicator is sized to expose the tie bar aperture and a front of the label holder when the indicator is coupled with the handle, the indicator having a second color different from the first color. The method further includes positioning the indicator over the handle body, and pressing on the indicator.

BRIEF DESCRIPTION OF DRAWINGS

These and other features, aspects, and advantages of the present disclosure will become better understood when the following detailed description is read with reference to the accompanying drawings in which like characters represent like parts throughout the drawings.

FIG. 1A is a perspective view of a known test switch assembly.

FIG. 1B is a perspective view of an example test switch assembly.

FIG. 2A is an enlarged view of a portion of the test switch assembly shown in FIG. 1B, identified as 2A.

FIG. 2B is an exploded view of the assembly shown in FIG. 2A.

FIG. 3 is a perspective view of the handle shown in FIGS. 1B-2B.

FIG. 4A is a top perspective view of the indicator shown in FIGS. 1B-2B.

FIG. 4B is a side perspective of the indicator.

FIG. 4C is a bottom perspective view of the indicator.

FIG. 5 is a flow chart of an example method of assembling a test switch assembly shown in FIGS. 1B-4C.

DETAILED DESCRIPTION

The disclosure includes indicators and test switch assemblies for electrical switchboard devices. Method aspects will be in part apparent and in part explicitly discussed in the following description.

FIG. 1A is a perspective view of a known test switch assembly 100. Known test switch assembly 100 includes a plurality of test switches 102. A test switch assembly is used for multi-circuit testing of relays, meters, and/or instruments in a switchboard. At a facility, a relatively large number of test switches 102 may be included. To test a device, the device is electrically coupled with test switch assembly 100, and some of the test switches 102 are flipped to open positions. Test plugs may be used to take measurements and readings of the device. At the end of the testing, open test switches 102-o should be returned to the closed positions such that the switchboard returns to a normal operation condition. A visual inspection is conducted after testing to confirm that the poles of all test switches have been closed. For example, a worker walks around and inspects the panels from one end of the control room to the other. In known systems, the visual verification may require extreme care to differentiate an open test switch from a closed test switch. Under industrial standards, test switches 102 are typically in black. Because black test switches are difficult to differentiate against the black bases of test switch assembly 100, the worker tends to fail to spot open poles, causing the circuits to remain open and the relays not providing protection in the event of system faults. The failure may result in damage to the utility equipment, financial loss, and/or safety risks to the operators of the utility.

Under industry standards, test switches 102 in colors other than black are reserved for specific circuits or poles. Further, the only cost-effective way to replace handles 154 of test switches 102 to different colors is to replace the entire test switch assembly 100. More importantly, to comply with industrial standards or conventions, a utility facility is reluctant to replace the colors of the handles 154.

In contrast, assemblies and methods described herein solve the above problems in known test assemblies. Indicators are included in a test switch assembly, where an indicator is coupled with the handle, and is in a different color from the handle, providing the contrast from the handle to sight an open pole. The indicators may be retrofitted to existing test switches in a test switch assembly, instead of replacing the entire test switch assembly, thereby reducing the costs to the facility while increasing the safety and the reliability of the facility. The indicators fit into the constrained space available in the row(s) of test switches without affecting the use of accessories, such as tie bars or labels, thereby minimizing interference in the existing operations of the facility.

FIG. 1B is a perspective view of an example test switch assembly 150. In the example embodiment, test switch assembly 150 includes one or more test switches 152. Test switches 152 may be in a row. Test switch 152 is open for testing a switchboard device, such as a relay or a meter. Test switch 152 includes a handle 154 to facilitate the opening and closing of test switch 152. Handle 154 is positioned at an end of test switch 152. Handle 154 may be fabricated from a material such as a thermoplastic material. Handle 154 is electrically insulative such that a user may be in contact with handle 154 in opening or closing test switch during the testing of switchboard devices.

In the example embodiment, test switch assembly 150 further includes an indicator 151. Indicator 151 couples with handle 154. Handle 154 has a first color. Stippling in the drawings (see FIG. 1B, and FIGS. 2A and 2B described later) is used to indicate a contrast in appearance, with no specific color or other feature being indicated. Indicator has a second color different from the first color. In the test switch assembly 150, indicators 151 are retrofitted onto test switches 152. In some embodiments, a test switch 152 is molded with an indicator 151 by a process such as a two-shot molding, where handle 154 is molded in a first color at first, and then indicator 151 is molded in a second color partially over handle 154. The process may be costly, due to the cost in re-designing a mold for the process. Indicator 151 in one single color is shown as an example for illustration purpose only. Indicator 151 may be in a plurality of colors. In that case, at least one of the plurality of colors is different from the color of handle 154 to provide a color contrast between indicator 151 and handle 154 for indicator 151 to be readily visible to an inspector to detect an open test switch 152. Individual indicators 151 in a test switch assembly 150 may be in the same color. Alternatively, individual indicators 151 in a test switch assembly 150 may be in different colors.

FIGS. 2A and 2B further show test switch assembly 150. FIG. 2A is an enlarged view of a portion of test switch assembly 150 as marked in FIG. 1B, where handle 154 of test switch 152 is coupled with indicator 151. FIG. 2B is an exploded view of the assembly shown in FIG. 2A. In the example embodiment, indicator 151 is coupled to handle 154 by being snap-fitted into handle 154.

FIG. 3 is a perspective view of handle 154. In the example embodiment, handle 154 includes a label holder 302 and handle body 304 extending from label holder 302. Label holder 302 includes a front 306. Label holder 302 defines a label slot 310 in front 306. Label slot 310 is sized to receive a label (not shown). A label may be press-fitted into label slot 310. A label is used to mark the pole of test switch 152.

In the example embodiment, handle body 304 extends from label holder 302, exposing label slot 310 to facilitate the placement of a label. Handle body 304 includes a handle top 312, a handle bottom 314 opposite handle top 312, a first handle side 317, and a second handle side 317 opposite first handle side 317. Handle sides 317 extend between handle top 312 and handle bottom 314. Handle top 312 may be concave. In some embodiments, handle top 312 is convex, flat, or in other shapes such as having concave, convex, and/or flat portions. Handle 154 may be molded into one single piece. Recesses 318 may be defined in handle side 317. Handle 154 further defines a tie bar aperture 156 sized to receive a tie bar 160 (see FIG. 1A). Tie bar aperture 156 spans through handle sides 317. Tie bar 160 connects multiple handles 154 together for certain testing.

FIGS. 4A-4C show example indicator 151. FIG. 4A is a top perspective view of indicator 151. FIG. 4B is a side perspective view of indicator 151. FIG. 4C is bottom perspective view of indicator 151. In the example embodiment, indicator 151 includes an indicator top 402. Indicator top 402 may include one or more indicator knurls 414 to increase grip on indicator 151. For example, when an operator flips test switch 152 open or close, the contact between the operator and test switch is increased by indicator knurls 414. Indicator top 402 includes a first edge 406-1 and a second edge 406-2 opposite the first edge 406-1. Indicator 151 further includes a first indicator side 404 extending from first edge 406-1. Indicator top 402 may further include a second indicator side 404 extending from second edge 406-2. Second indicator side 404-2 is positioned opposite first indicator side 404-1, where indicator sides 404 extend from handle top 312 in the same direction such that first indicator side 404-1 and second indicator side 404-2 face one another.

In the example embodiment, indicator 151 includes a projection 408 extending from indicator side 404. Projection 408 is positioned on a surface 412 of indicator side 404 that face the other indicator side 404. Indicator 151 may include a plurality of projections 408. Projections 408 may be in pairs such that one projection 408 of the pair is on one indicator side 404, the other projection 408 of the pair is on the other indicator side 404, and projections 408 in the pair face one another. In some embodiments, projections 408 are not in pairs, where for an projection 408, indicator 151 does not include a corresponding projection 408 positioned on an opposite indicator side 404 and facing the projection 408. Projection 408 is pinched against handle side 317, received in recess 318, and/or both.

In the example embodiment, the interior width 416 of indicator top 402 between indicator sides 404 is slightly greater than the exterior width 315 of handle top 312 (see FIG. 3) and the distance 418 between two opposing projections 408 is slightly smaller than exterior width 315 of handle top 312. As a result, indicator top 402 and indicator sides 404 are positioned outside handle 154 with projections pinching against handle sides 317 or being received in recess 318 of handle 154.

In the example embodiment, handle side 317 forms into a ridge 220 (FIGS. 3, also see FIG. 2B) by recess 318 on handle side 317. Ridge 220 extends further away from handle side 317 than its adjacent part of handle side 317. Ridge 220 extends from handle top 312. Projection 408 is received in recess 318 and under ridge 220 such that ridge 220 is received in the gap 219 (see FIG. 2B) between projection 408 and underside 221 of indicator top 402. Projections 408 may hold against ridge 220 such that indicator 151 is coupled with handle body 304 via friction between projections 408 and ridge 220. Side protrusions 320 may be formed on handle side 317 by recess 318. Ridge 220 intersects side protrusions 320, defining end points 224 of ridge 220. End points 224 limits indicator 151 from sliding past them, thereby holding indicator 151 in place with handle body 304.

In some embodiments, indicator sides 404 do not include projections. The interior width 416 between indicator sides 404 is slightly smaller than or equal to the exterior width 315 of handle top 312 such that indicator 151 is coupled with handle 154 via the friction force between indicator sides 404 and handle sides 317.

In the example embodiment, indicator 151 defines one or more shutoff apertures 422 (FIG. 4A) for improving the ease in the molding process and mold maintenance. Shutoff apertures 422 may be defined in indicator top 402 and/or indicator side 404. Indicator 151 is fabricated with a material such as a thermoplastic or thermosetting material. Example materials include epoxy, silicone, rubber, polyethylene, polypropylene, polyvinyl chloride, or a combination thereof. Indicator 151 may be fabricated via processes such as molding or three-dimensional (3D) printing.

In the example embodiment, indicator 151 is one single piece. A single-piece indicator is advantageous in increasing the speed of assembling the indicators with the test switches. Preassembling of a single-piece indicator is not needed. If the indicator is in two or more pieces, for example, including a left side piece to be fitted with the left side of the handle and a right side piece to be fitted with the right side, time is needed to place to the pieces to the correct sides of the handle.

In operation, to assemble an indicator 151 with a test switch 152, indicator 151 is snap-fitted on handle 154. Indicator 151 is positioned on handle top 312 with underside 221 of indicator top 402 facing handle top 312. A force is applied to indicator top 402 to push indicator 151 downward. Projections 408 are received in recesses 318 of handle 154. Indicator 151 couples with handle body 304 at first indicator side 404, second indicator side 404, and/or projections.

When handle top 312 includes handle knurls 214 (see FIG. 2B), during assembling, indicator knurls 414 may be positioned over handle knurls 214 such that indicator knurls 414 are positioned adjacent label holder 302, increasing the grip on test switch assembly 150 in opening or closing test switch 152. Handle knurls 214 also increase the friction between indicator 151 and handle 154, thereby increasing the coupling strength between indicator 151 and handle 154.

In some embodiments, handle 154 does not define a recess 318 or a through aperture between tie bar aperture 156 and handle top 312. Projections 408 may be positioned adjacent bottom edges 407 (FIG. 4C) of indicator sides 404 such that projections 408 are received in tie bar aperture 156. Tie bar aperture 156 may be partially blocked by indicator sides 404. Alternatively, projections 408 are not received in tie bar aperture 156 and instead pinch against handle sides 317 to couple indicator 151 with handle 154.

The assembling of indicators 151 with handle 154 is relatively fast and easy. Indicators 151 may be assembled with or removed from handles 154 without a tool.

Referring back to FIGS. 1B-2B, in the example embodiment, indicator 151 partially covers handle 154. For example, indicator 151 covers most part of handle top 312 and partially covers handle sides 317, while leaving label holder 302 uncovered. As a result, indicator 151 is readily visible to an inspector when test switch 152 is open. For example, when test switch 152 is closed, the original color, such as black, of handle 154 is mostly visible to the inspector, while when test switch 152 is open, indicator 151 is mostly visible to the inspector. The color contrast between the indicator 151 and the handle 154 provides visibility of open test switches 152, thereby improving the accuracy of inspection and the safety of the electrical system, and reducing potential loss or damage from open test switches during normal operations.

A test switch assembly 150 typically includes a relatively large number of test switches. The test switches are in relatively small sizes and positioned relatively close to one another in an effort to reduce the overall size of test switch assembly 150. As a result, test switch assembly 150 provides limited available space for retrofitting indicators. To increase the strength of coupling between indicator 151 and handle 154 and the visibility of indicator 151, the size of indicator 151 may be in the full extent of the allowable space. In the example embodiment, the shape of indicator top 402 conforms with the shape of handle top 312. A conforming shape of indicator top 402 is advantageous in maximizing the use of the available space in test switch assembly 150 while increasing the coupling strength between indicator 151 and handle 154. In some embodiments, indicator sides 404 of indicator 151 also conform with handle side 317. A conforming fitting of indicator 151 with handle 154 efficiently uses the limited available space in a test switch assembly 150 while increasing the strength of coupling of indicator 151 with handle 154.

In the example embodiment, when indicator 151 is coupled with handle 154, indicator sides 404 extends downward and arch around tie bar aperture 156. As a result, indicator sides 404 expose tie bar aperture 156 and do not affect the placement of a tie bar 160 through tie bar aperture 156. Further, indicator 151 is coupled with handle body 304 while leaving label holder 302 exposed. Accordingly, the indicators and test switch assemblies described herein are advantageous in retrofitting exiting test switch assemblies without incurring changes to the existing operations of the test switch assemblies.

Indicators described herein are not limited to be retrofitted to existing test switch assemblies. Indicators may be assembled with handles during the fabrication of the test switch assemblies.

FIG. 5 is a flow chart of an example method 500 of assembling a test switch assembly. In the example embodiment, method 500 includes providing 502 an indicator. An example indicator is indicator 151 described herein. Method 500 further includes positioning 504 the indicator over the handle body of a handle of a test switch in a test switch assembly. Method 500 also includes pressing 506 on the indicator until at least one of the first indicator side, the second indicator side, or a projection of the indicator is coupled with the handle body.

At least one technical effect of the systems and methods described herein includes (a) indicators configured to be retrofitted with handles of a test switch assembly; and (b) color contrast between the indicator and the handle providing increased visibility of an open test switch.

Example embodiments of test switch assemblies and methods of assembling test switch assemblies are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

As used herein, an element or step recited in the singular and proceeded with the word "a" or "an" should be understood as not excluding plural elements or steps, unless such exclusion is explicitly recited. Furthermore, references to "example" or "one example" of the present disclosure are not intended to be interpreted as excluding the existence of additional examples that also incorporate the recited features. Further, to the extent that terms "includes," "including," "has," "contains," and variants thereof are used herein, such terms are intended to be inclusive in a manner similar to the term "comprises" as an open transition word without precluding any additional or other elements.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A test switch assembly for testing electrical switchboard devices, the test switch assembly comprising:
   a test switch comprising a handle, the handle having a first color, the handle comprising:
   a label holder comprising a front, the label holder defining a label slot in the front, the label slot sized to receive a label; and
   a handle body extending from the label holder and defining a tie bar aperture sized to receive a tie bar configured to connect the test switch with one or more other test switches in the test switch assembly; and
   an indicator coupled with the handle body of the test switch, the indicator having a second color different from the first color, the indicator exposing the tie bar aperture.

2. The test switch assembly of claim 1, wherein the handle body comprises a handle top, and the indicator further comprises an indicator top, the indicator top having a shape conforming with a shape of the handle top.

3. The test switch assembly of claim 1, wherein the indicator further comprises an indicator top, the indicator top comprising one or more indicator knurls.

4. The test switch assembly of claim 1, wherein the indicator is one single piece.

5. The test switch assembly of claim 1, wherein the indicator is retrofitted onto the handle.

6. The test switch assembly of claim 1, wherein the indicator further comprises:
   an indicator top having a first edge and a second edge opposite the first edge;
   a first indicator side extending from the first edge; and
   a second indicator side extending from the second edge,
   wherein the indicator does not include a projection extending from the first indicator side or the second indicator side.

7. The test switch assembly of claim 1, wherein the indicator further comprises:
   an indicator top having a first edge and a second edge opposite the first edge;
   a first indicator side extending from the first edge; and
   a first projection extending from the first indicator side,
   wherein the indicator is coupled with the handle body via the first projection.

8. The test switch assembly of claim 7, wherein the handle body comprises:
   a handle top; and
   a handle side extending from the handle top, the handle side defining a recess and forming a ridge by the recess,
   wherein the indicator is coupled with the handle body via friction between the first projection and the ridge.

9. The test switch assembly of claim 7, wherein the indicator further comprises:
   a second indicator side extending from the second edge; and
   a second projection extending from the second indicator side,
   wherein the indicator is coupled with the handle body via the first projection and the second projection.

10. An indicator for detecting an open test switch in a test switch assembly for testing electrical switchboard devices, the test switch assembly comprising a test switch, the test switch comprising a handle, the handle having a first color, the handle comprising a label holder and a handle body extending from the label holder and defining a tie bar aperture sized to receive a tie bar, the indicator comprising:
   an indicator top having a first edge and a second edge opposite the first edge;
   a first indicator side extending from the first edge; and
   a second indicator side extending from the second edge,
   wherein the indicator is configured to couple with the handle body and sized to expose the tie bar aperture and a front of the label holder when the indicator is coupled with the handle, the indicator having a second color different from the first color.

11. The indicator of claim 10, wherein the indicator top has a shape conforming with a shape of a handle top of the handle body.

12. The indicator of claim 10, wherein the indicator top includes one or more indicator knurls.

13. The indicator of claim 10, wherein the indicator is one single piece.

14. The indicator of claim 10, wherein the indicator is configured to be retrofitted onto the handle.

15. The indicator of claim 10, wherein the indicator does not include a projection extending from the first indicator side or the second indicator side.

16. The indicator of claim 10, further comprising a first projection extending from the first indicator side, wherein the indicator is configured to couple with the handle body via the first projection.

17. The indicator of claim 16, wherein the indicator is configured to couple with the handle body via friction between the first projection and a ridge of the handle body.

18. The indicator of claim 16, further comprising a second projection extending from the second indicator side, wherein the indicator is configured to couple with the handle body via the first projection and the second projection.

19. A method of assembling a test switch assembly for testing electrical switchboard devices, the test switch assembly including a test switch, the test switch including a handle, the handle having a first color, the handle including a label holder and a handle body extending from the label holder and defining a tie bar aperture sized to receive a tie bar, the method comprising:

providing an indicator, the indicator including:

an indicator top having a first edge and a second edge opposite the first edge;

a first indicator side extending from the first edge; and a second indicator side extending from the second edge, wherein the indicator is sized to expose the tie bar aperture and a front of the label holder when the indicator is coupled with the handle body, the indicator having a second color different from the first color;

positioning the indicator over the handle body; and pressing on the indicator.

20. The method of claim 19, wherein pressing on the indicator further comprises:

pressing on the indicator until a projection extending from the first indicator side or the second indicator side is snap-fitted into a recess defined in a handle side of the handle body.

\* \* \* \* \*